United States Patent
Tran et al.

(10) Patent No.: US 9,425,325 B2
(45) Date of Patent: *Aug. 23, 2016

(54) ELECTRICALLY PROGRAMMABLE AND ERASEABLE MEMORY DEVICE

(71) Applicant: Cypress Semiconductor Corporation, San Jose, CA (US)

(72) Inventors: Minh Q. Tran, Milpitas, CA (US); Minh-Van Ngo, Fremont, CA (US); Alexander H. Nickel, Mountain View, CA (US); Jeong-Uk Huh, Santa Clara, CA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/153,900

(22) Filed: Jan. 13, 2014

(65) Prior Publication Data

US 2014/0124848 A1 May 8, 2014

Related U.S. Application Data

(63) Continuation of application No. 12/284,002, filed on Sep. 17, 2008, now Pat. No. 8,633,074.

(51) Int. Cl.
| | |
|---|---|
| *H01L 29/788* | (2006.01) |
| *H01L 27/115* | (2006.01) |
| *H01L 21/28* | (2006.01) |
| *H01L 29/51* | (2006.01) |
| *H01L 29/792* | (2006.01) |

(52) U.S. Cl.
CPC ...... *H01L 29/7888* (2013.01); *H01L 21/28282* (2013.01); *H01L 27/11517* (2013.01); *H01L 27/11563* (2013.01); *H01L 29/513* (2013.01); *H01L 29/792* (2013.01)

(58) Field of Classification Search
CPC .............. H01L 27/11517; H01L 27/11563; H01L 29/788; H01L 29/7888
USPC .............. 257/316, 322, E29.3, E29.309
See application file for complete search history.

(56) References Cited

U.S. PATENT DOCUMENTS

| | | | |
|---|---|---|---|
| 5,940,325 A | 8/1999 | Chang et al. | |
| 6,064,595 A | 5/2000 | Logie et al. | |
| 6,157,059 A | 12/2000 | Kauffman et al. | |
| 6,930,060 B2 * | 8/2005 | Chou et al. | 438/786 |
| 2003/0151948 A1 | 8/2003 | Bhattacharyya | |
| 2005/0018490 A1 * | 1/2005 | Leconte et al. | 365/185.29 |

(Continued)

FOREIGN PATENT DOCUMENTS

| | | |
|---|---|---|
| JP | 59055062 A | 3/1984 |
| JP | 59055064 | 3/1984 |

OTHER PUBLICATIONS

Guo et al. "Tunneling Leakage Current in Oxynitride; Dependence on Oxygen/Nitrogen Content", Jun. 1998, IEEE Electron Device Letters, vol. 19, No. 6, pp. 207-209.

(Continued)

*Primary Examiner* — Joseph C Nicely (57) ABSTRACT

The present claimed subject matter is directed to memory device that includes substrate, a tunneling layer over the substrate, a floating gate over the tunneling layer, a dielectric over the floating gate and including silicon oxynitride, and a control gate over the dielectric.

8 Claims, 9 Drawing Sheets

(56) References Cited

U.S. PATENT DOCUMENTS

| | | |
|---|---|---|
| 2006/0035433 A1 | 2/2006 | Jung |
| 2006/0211212 A1 | 9/2006 | Banieckil et al. |
| 2008/0093646 A1* | 4/2008 | Lee et al. .................... 257/314 |
| 2008/0146013 A1 | 6/2008 | Ino et al. |
| 2008/0230826 A1* | 9/2008 | Das .............................. 257/316 |
| 2009/0079016 A1 | 3/2009 | Chen et al. |
| 2009/0140318 A1 | 6/2009 | Dong |
| 2009/0201741 A1 | 8/2009 | Eitan et al. |
| 2009/0234838 A1 | 9/2009 | Li |
| 2009/0236684 A1 | 9/2009 | Lee |
| 2009/0294838 A1 | 12/2009 | Lee et al. |
| 2010/0018460 A1 | 1/2010 | Singh et al. |
| 2010/0102376 A1 | 4/2010 | Ma et al. |
| 2010/0129969 A1 | 5/2010 | Kawamata et al. |
| 2010/0207181 A1* | 8/2010 | Ahn et al. .................... 257/310 |
| 2010/0311217 A1 | 12/2010 | Wu et al. |
| 2012/0127796 A1* | 5/2012 | Eitan et al. ............... 365/185.15 |
| 2012/0223380 A1* | 9/2012 | Lee et al. ..................... 257/321 |

OTHER PUBLICATIONS

USPTO Final Rejection for U.S. Appl. No. 12/284,002 dated Feb. 24, 2012; 12 pages.
USPTO Final Rejection for U.S. Appl. No. 12/284,002 dated Apr. 14, 2011; 19 pages.
USPTO Final Rejection for U.S. Appl. No. 12/284,002 dated Nov. 21, 2012; 8 pages.
USPTO Non-Final Rejection for U.S. Appl. No. 12/284,002 dated May 8, 2013; 20 pages.
USPTO Non-Final Rejection for U.S. Appl. No. 12/284,002 dated Jul. 24, 2012; 18 pages.
USPTO Non-Final Rejection for U.S. Appl. No. 12/284,002 dated Oct. 24, 2011; 23 pages.
USPTO Non-Final Rejection for U.S. Appl. No. 12/284,002 dated Nov. 9, 2010; 14 pages.
USPTO Notice of Allowance for U.S. Appl. No. 12/284,002 dated Sep. 16, 2013; 10 pages.

* cited by examiner

(Prior Art)

FIGURE 20

(Prior Art)

FIGURE 21

(Prior Art)

FIGURE 22

US 9,425,325 B2

ELECTRICALLY PROGRAMMABLE AND ERASEABLE MEMORY DEVICE

CROSS REFERENCES TO RELATED APPLICATIONS

This application is a continuation of U.S. patent application Ser. No. 12/284,002, filed Sep. 17, 2008, which is incorporated by reference herein in its entirety and for all purposes.

BACKGROUND OF THE INVENTION

Figure 1:
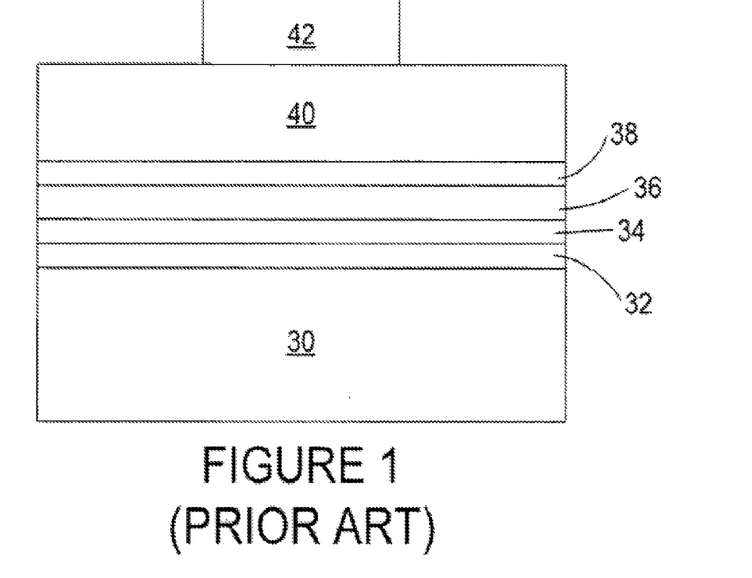
FIGS. 1-4 illustrate process steps in formation of a prior art memory device.
Figure 2:
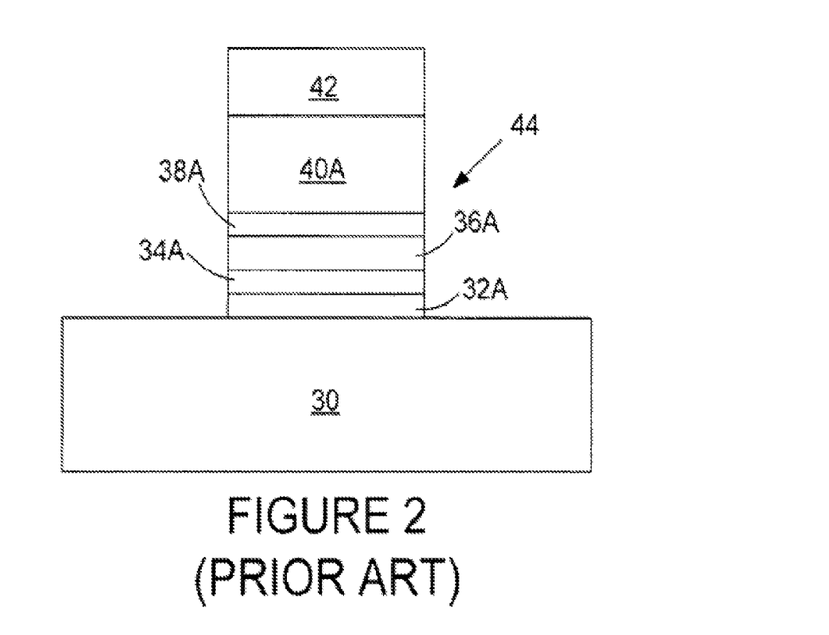
Figure 3:
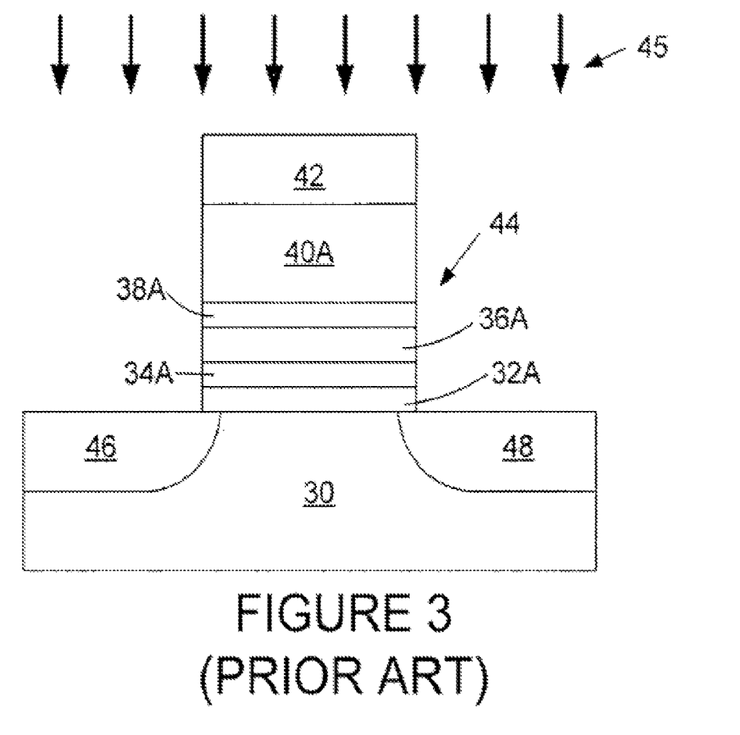

FIGS. 1-4 illustrate a prior art electrically programmable and erasable memory device and a method of fabrication thereof. Initially, with reference to FIG. 1, a substrate, for example a P type silicon substrate 30, is provided. A silicon dioxide ($SiO_2$) layer 32 is grown thereon, and successive layers of silicon nitride (SiN) 34, silicon dioxide ($SiO_2$) 36, silicon nitride (SiN) 38, and P+ polysilicon 40 are deposited. A layer of photoresist is then provided on the polysilicon layer 40, and portions of the photoresist layer are removed using a we known procedure, so that the remaining photoresist 42 is provided on the polysilicon layer 40 as shown in FIG. 1. Using this remaining photoresist 42 as a mask, an etching step is undertaken to remove portions of the layers 40, 38, 36, 34, 32, forming a stack 44 including remaining layers of silicon dioxide 32A, silicon nitride 34A, silicon dioxide 36A, silicon nitride 38A and polysilicon 40A on the substrate 30 (FIG. 2).

An on implantation step 45 is undertaken, in this example using n-type dopant, to form N+ source 46 and drain 48 in the substrate 40, the photoresist 42 and the layers therebeneath acting as a mask. (FIG. 3) The photoresist 42 is then removed, resulting in the structure 49 shown in FIG. 4.

Figure 4:
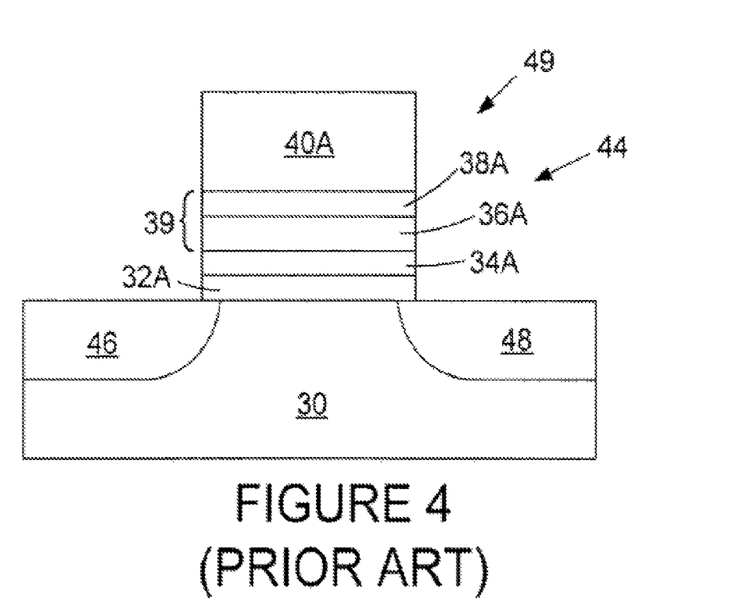

This structure 49 is an electrically programmable and erasable memory device wherein the silicon dioxide layer 32A is a tunneling gate layer, the silicon nitride layer 34A is a storage layer (floating gate), the silicon dioxide layer 36A and silicon nitride layer 38A together form a dielectric 39 between the storage layer 34A and the polysilicon layer 40A, and the polysilicon layer 40A is the control gate of the device 49.

In programming the device 49, as is well known, a positive voltage is applied to the drain 48, and the source 46 is grounded. Applying a positive voltage pulse of sufficient magnitude to the control gate 40A causes electrons to travel from the substrate 30 through the tunneling gate layer 32A and into the storage layer 34A, such electrons stored in the storage layer 34A causing the device 49 to be in its programmed state. In the erasing of the device 49, a positive voltage is applied to the control gate 40A, while the substrate 30, source 46 and drain 48 are grounded. Applying a positive voltage pulse of sufficient magnitude to the control gate 40A causes holes in the gate 40A to travel through the dielectric 39 (which includes layers 36A, 38A) and into the storage layer 34A, wherein they are combined with electrons stored in the storage layer 34A to cause the device 49 to be in its erased state.

While the device 49 thus far shown and described is highly efficient in operation, it will be understood that it is always desirable to improve operational speed thereof. In furtherance thereof, the present approach improves erase speed as compared to the prior device as will be shown and described.

SUMMARY OF THE INVENTION

Broadly stated, in the present approach a method of forming a memory device is provided, comprising providing a substrate, providing a tunneling layer over the substrate, providing a floating gate over the tunneling layer, providing a dielectric over the floating gate comprising providing a first insulating layer over the floating gate, providing a second insulating layer over the first insulating layer, and providing a third insulating layer over the second insulating layer, and providing a control gate over the dielectric.

Broadly stated, in the present approach, is memory device comprises a substrate, a tunneling layer over the substrate a floating gate over the tunneling layer, a dielectric over the floating gate and comprising silicon oxynitride, and a control gate over the dielectric.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein:

DETAILED DESCRIPTION

Reference is now made in detail to specific embodiments of the present invention which illustrate the best mode presently contemplated by the inventors for practicing the invention.

FIGS. 5-8 illustrate the present electrically programmable and erasable memory device and method of fabrication thereof. Similar to the above, initially, with reference to FIG. 5, a substrate 50, for example a P type silicon substrate, is provided, and a silicon dioxide ($SiO_2$) layer 52 is grown thereon. A layer of silicon nitride (SiN) 54 is deposited on, over and in contact with the layer 52, and a layer of silicon dioxide ($SiO_2$) 56 is deposited on, over and in contact with the layer 54. Next, and different from the previous from the previous process, a layer of silicon oxynitride (SiON) 58 is provided on, over and in contact with the layer 56. This silicon oxynitride layer 58 may be provided in a variety of different manners, which will be described in detail with reference to FIGS. 9-16. Then, silicon nitride (SiN) layer 60 is deposited on, over and in contact with the layer 58, and P+ polysilicon layer 62 is deposited on, over and in contact with the layer.

Figure 5:
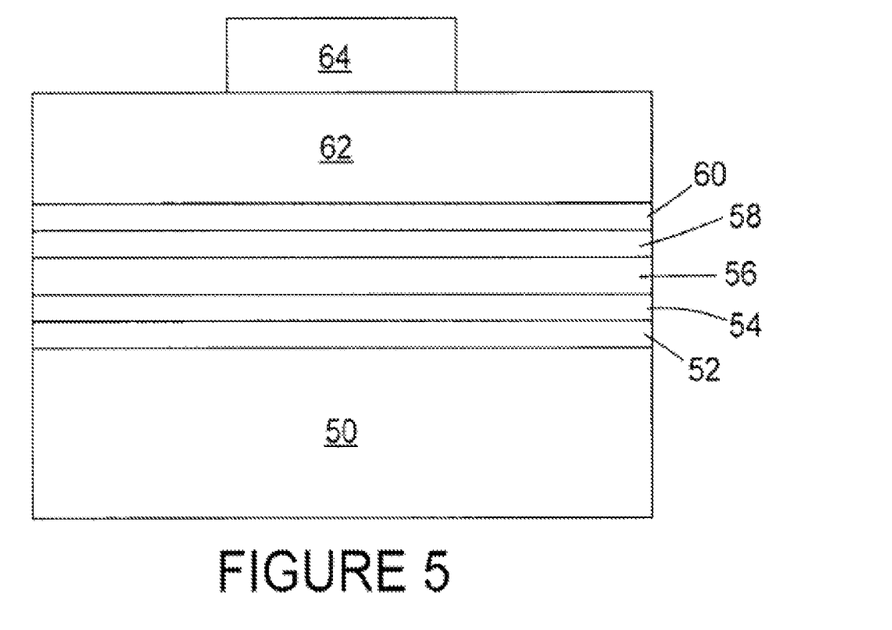
FIGS. 5-8 illustrate process steps in formation of the present memory device.
Figure 6:
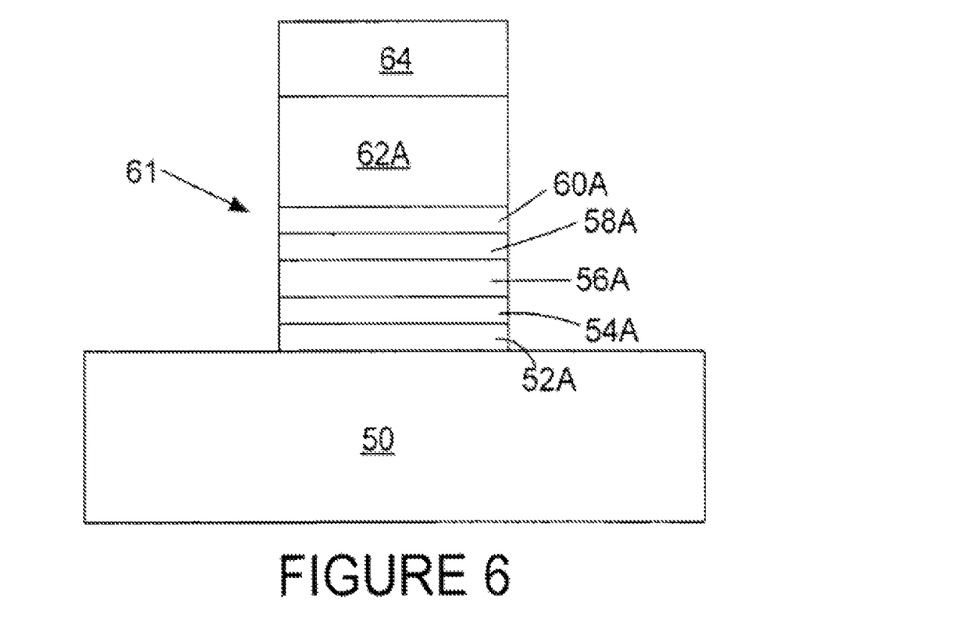

A layer of photoresist is then provided on the polysilicon layer 62, and portions of the photoresist layer are removed using a well known procedure, so that the remaining photoresist 64 is provided on the polysilicon layer 62 as shown in FIG. 5. Using this remaining photoresist as a mask, an etching step is undertaken to remove portions of the layers 62, 60, 58, 56, 54, 52, forming a stack 61 including remaining layers of silicon dioxide 52A, silicon nitride 54A, silicon dioxide 56A, silicon oxynitride 58A, silicon nitride 60A, and polysilicon layer 62A on the substrate 50 (FIG. 5).

Figure 7:
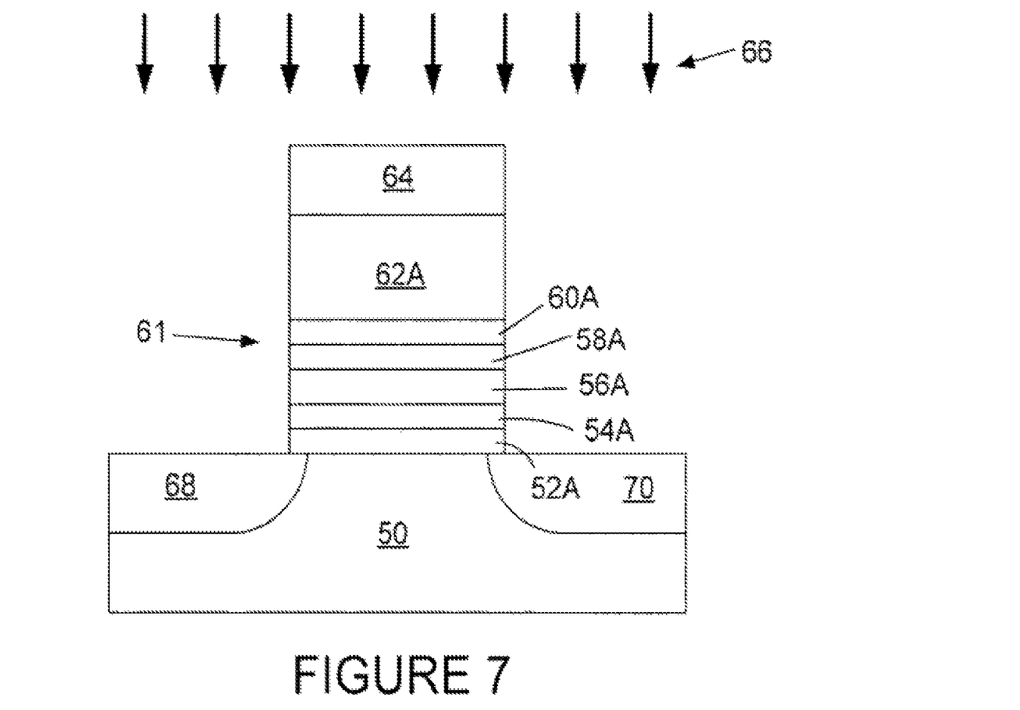

An ion implantation step 66 is undertaken, in this example using n-type dopant, to form N+ source 68 and drain 70 in the substrate 50, the photoresist 64 and the layers therebeneath acting as a mask (FIG. 7). The photoresist 64 is then removed, resulting in the structure 72 shown in FIG. 8.

Figure 8:
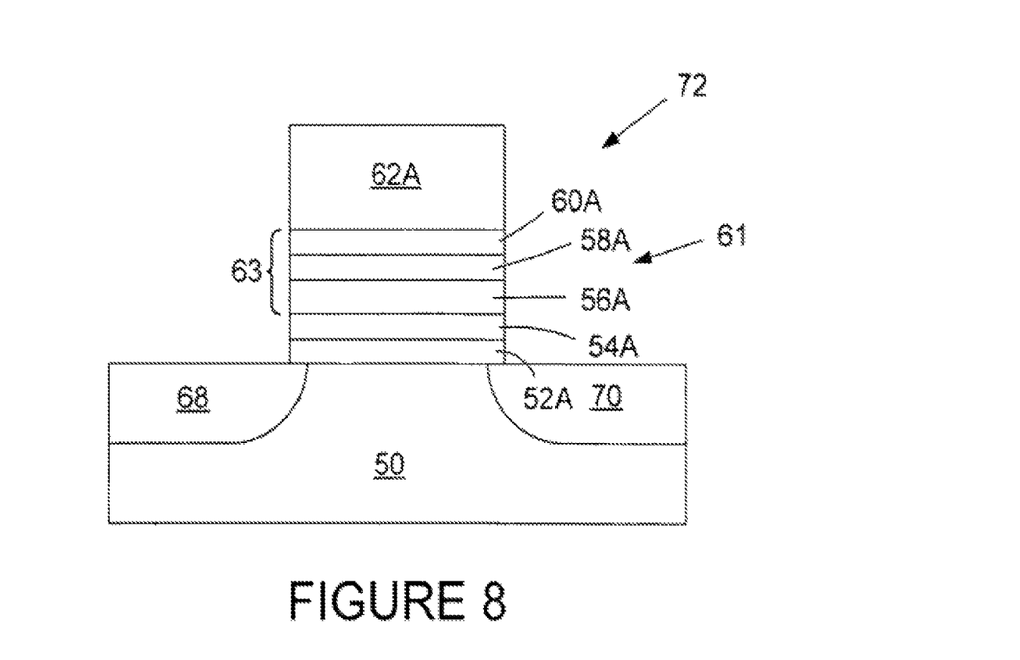

This structure 72 is an electrically programmable arid erasable memory device wherein the silicon dioxide layer 52A is a tunneling gate layer, the silicon nitride layer 54A is a storage layer (floating gate), the silicon dioxide layer 56A, silicon oxynitride layer 58A, and silicon nitride layer 60A together form a dielectric 63 between the storage layer 54A and the polysilicon layer 62A, and the polysilicon layer 62A is the control gate of the device 72.

Again, in programming the device 72, a positive voltage is applied to the drain 70, and the source 68 is grounded. Applying a positive voltage pulse of sufficient magnitude to the control gate 62A causes electrons to travel from the substrate 50 through the tunneling gate layer 52A and into the storage layer 54A, such electrons stored in the storage layer 54A causing the device 72 to be in its programmed state. In the erasing of the device 72, a positive voltage is applied to the control gate 62A. a positive voltage is applied to the drain 70, the source 68 is grounded, and the substrate 50 is allowed to float. Applying a positive voltage pulse of sufficient magnitude to the control gate 62A causes holes in the control gate 62A to travel through the dielectric 63 (which includes layers 56A, 58A, 60A) and into the storage layer 54A, wherein they are combined with electrons stored in the storage layer 54A to cause the device 72 to be in its erased state. However, due to the inclusion of the silicon oxynitride layer 58 in the memory device 72, the erase mechanism of the device 72 is fundamentally different from that as previously shown and described above. This mechanism will be shown and described further on. The various approaches for providing the silicon oxynitride layer 58 will now be described with reference to FIGS. 9-16.

Figure 9:
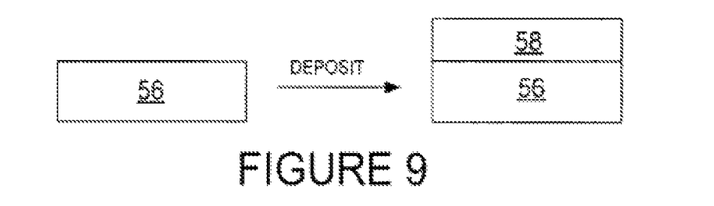
FIGS. 9-16 illustrate various alternative process steps in formation of particular portions of the present memory device.

In a first approach, and referring to FIG. 9, silicon oxynitride layer 58 is deposited on, over and in contact with silicon dioxide layer 56 by for example Plasma-Enhanced Chemical Vapor Deposition (PECVD), Or Low Pressure Chemical Vapor Deposition (LPCVD).

Figure 10:
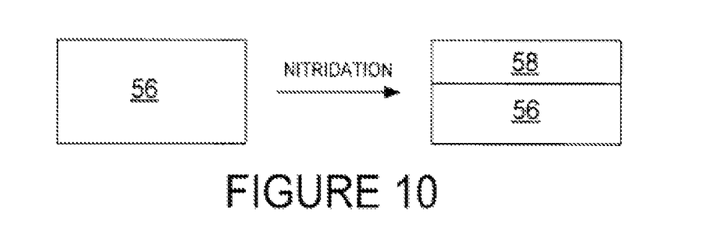

In another approach, referring to FIG. 10, the silicon oxynitride layer 58 is formed by nitridation of a top portion of the silicon dioxide layer 56, by nitrogen-containing (e.g., $NH_3$, $N_2O$, or $N_2$) plasma treatment, forming silicon oxynitride layer on, over and in contact with silicon dioxide layer 56.

Figure 11:
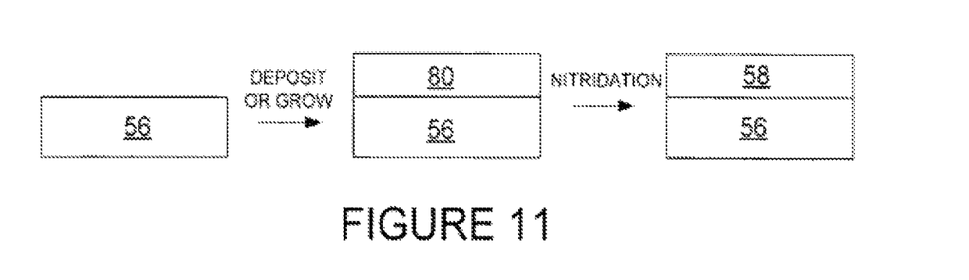

In yet another approach, referring to FIG. 11, a silicon dioxide layer 80 is provided on the silicon dioxide layer 56 by deposition (by for example PECVD or LPCVD) or growth by thermal oxidation, and nitridation of that silicon dioxide layer Nis undertaken, by nitrogen-containing (e.g., $NH_3$, $N_2O$, or $N_2$) plasma treatment, forming silicon oxynitride layer 58 on, over and in contact with silicon dioxide layer 56.

Figure 12:
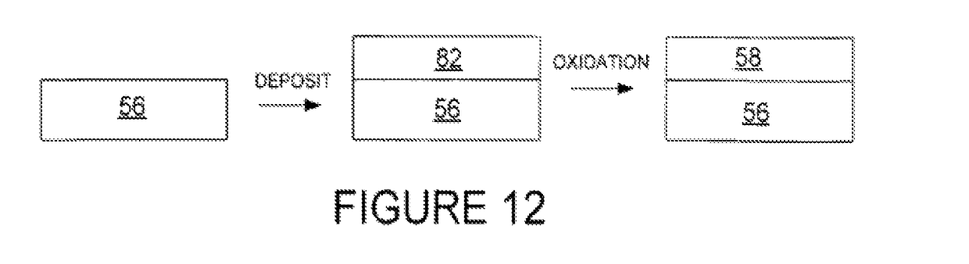

In yet another approach, referring to FIG. 12, a silicon nitride layer 82 is deposited on the silicon dioxide layer 56 (by for example PECVD or LPCVD), and oxidation of that silicon nitride layer 82 is undertaken by for example direct contact oxygen or ozone plasma (e.g., PECVD or High Density Plasma (HDP)), or by remote oxygen or ozone plasma, or by a steam oxidation, forming silicon oxynitride layer 58 on, over and in contact with silicon dioxide layer 56.

Figure 13:
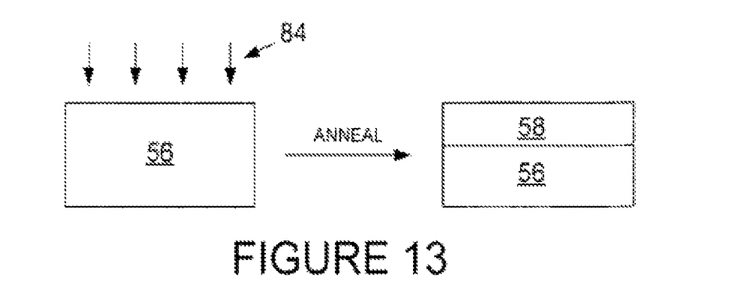

In yet another approach, referring to FIG. 13, nitrogen is implanted 84 into the top portion of the silicon dioxide layer 56, and a high temperature anneal step is undertaken (by for example furnace, or by rapid thermal anneal (RTA), or by laser anneal), causing bonding of silicon, oxygen and nitrogen to form silicon oxynitride layer 58 on, over and in contact with silicon dioxide layer 56.

Figure 14:
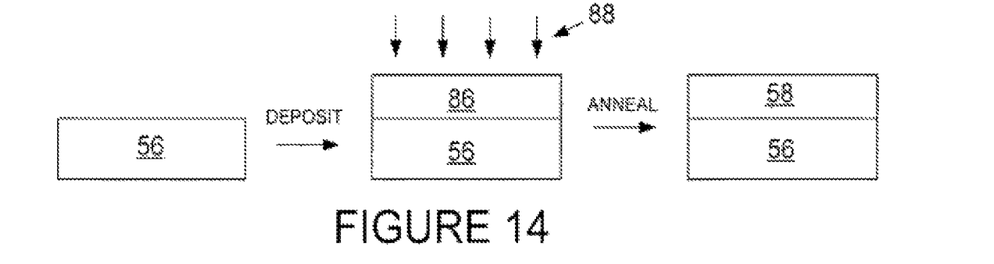

In yet another approach, referring to FIG. 14, a silicon dioxide layer 86 is provided on the silicon dioxide 56 layer by deposition (by for example PECVD or LPCVD) or growth by thermal oxidation, nitrogen is implanted 88 into the silicon dioxide layer 86, and a high temperature anneal step is undertaken (by for example furnace, by RTA, or by laser anneal), causing bonding of silicon, oxygen and nitrogen to form silicon oxynitride layer 58 on, over and in contact with silicon dioxide layer 56.

Figure 15:
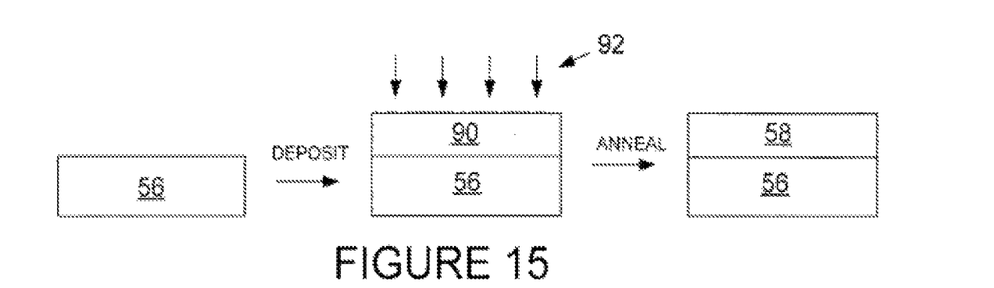

In yet another approach, referring to FIG. 15, a silicon nitride layer 90 is deposited on the silicon dioxide layer 56 (by example PECVD or LPCVD), oxygen is implanted 92 into the silicon nitride layer 90, and a high temperature anneal step is undertaken (by for example furnace, or RTA, or by laser anneal), causing bonding of silicon, oxygen and nitrogen to form silicon oxynitride 58 layer on, over and in contact with silicon dioxide layer 56.

Figure 16:
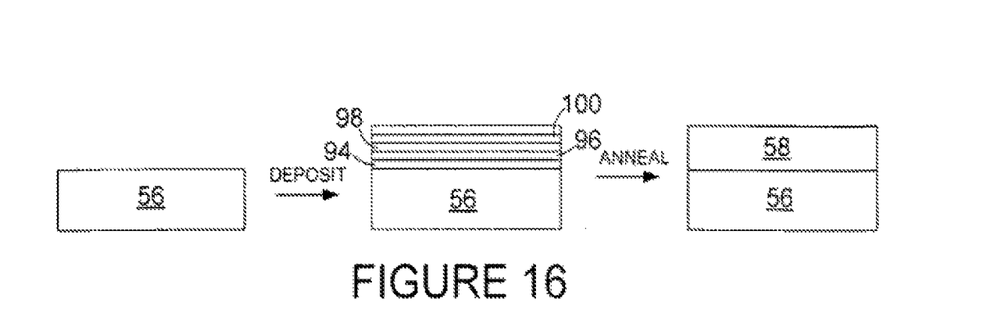

In yet another approach, referring to FIG. 16, alternate silicon nitride and silicon dioxide monolayers 94, 96, 98, 100 . . . are deposited on the silicon dioxide layer 56 by a atomic layer deposition (ALD) and a high temperature anneal step is undertaken (by for example furnace, by RTA, or by laser anneal), causing bonding of silicon, oxygen and nitrogen of the monolayers 94, 96, 98, 100 . . . to form silicon oxynitride layer 58 on, over and in contact with silicon dioxide layer 56.

Figure 17:
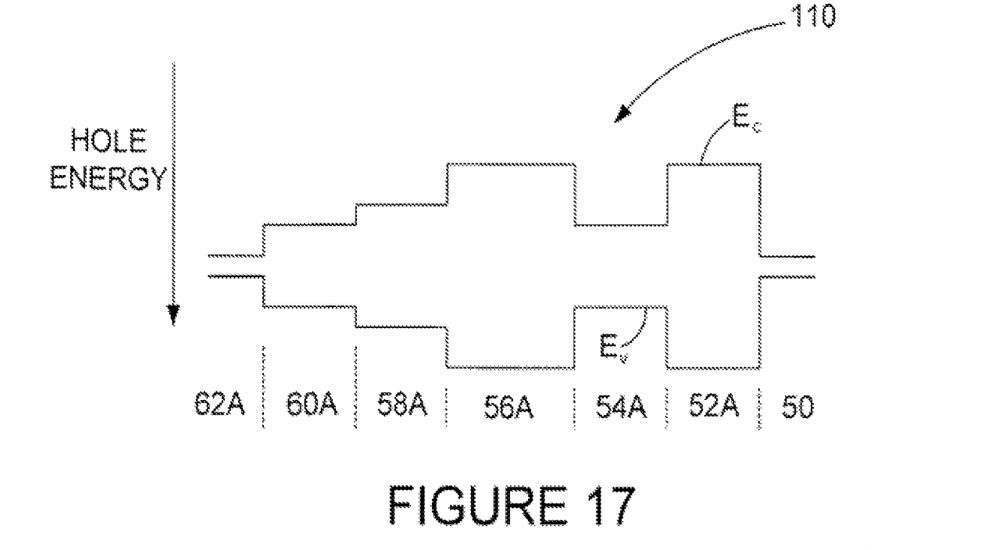
FIGS. 17 and 18 illustrate different states of energy band diagrams for the present memory device.
Figure 18:
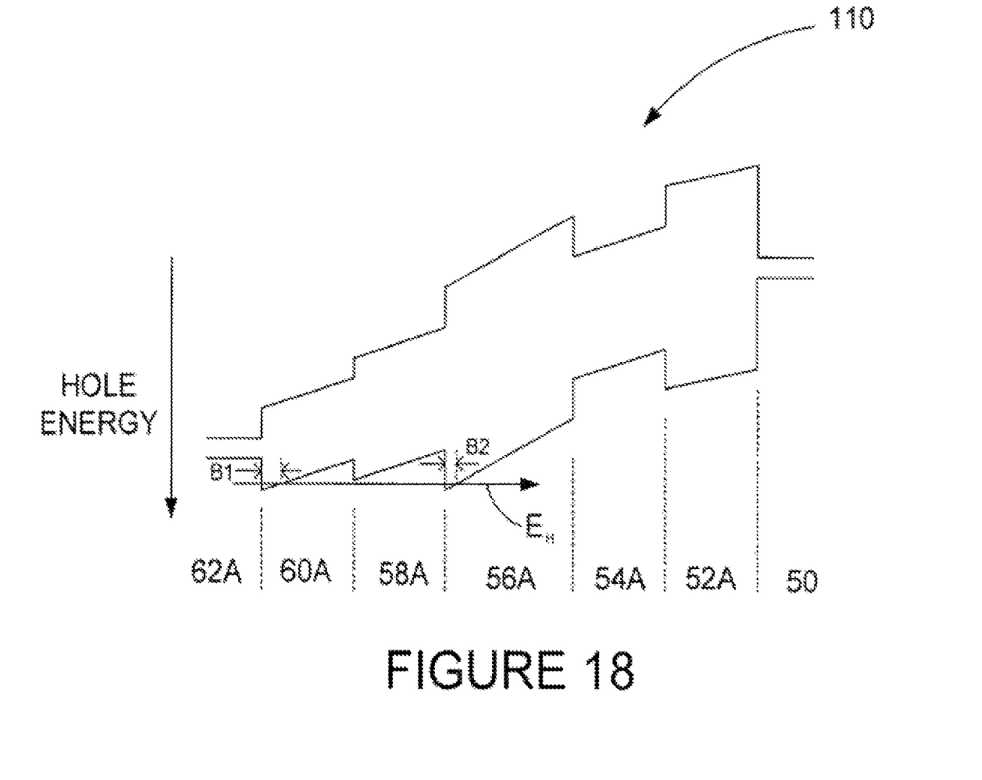

FIG. 17 illustrates the energy band diagram 110 for the device 72 of FIG. 8, without electrical potential applied thereto. This diagram illustrates conduction energy $E_c$ and valence energy $E_v$. As shown, the layer 56A, layer 58A, and layer 60A have successively smaller energy band gaps. As noted above, in the erasing of the memory device 72, holes must travel from the polysilicon gate 62A through the layers 60A, 58A, 56A and into the storage layer 54A. Movement of holes from the gate 62A to the storage layer 54A with the energy band diagram 110 as shown in FIG. 17 requires sufficient energy to overcome energy $E_v$ of the oxide layer 56A (hole energy increasing in a downward direction in FIG. 17). This level of energy is substantial, creating a significant barrier to such hole movement. Applying a selected positive voltage of a magnitude $V_{g1}$ to the polysilicon gate 62A while holding the substrate 50, source 68 and drain 70 at ground causes the energy bands to shift to levels shown in FIG. 18, greatly reducing the barriers presented by the layers 60A, 58A, and 56A. In the present example, voltage $V_{g1}$ is sufficient to substantially reduce the barrier presented by layer 60A to B1, eliminate the barrier presented by layer 58A, and substantially reduce the barrier presented by layer 56A to B2. With the barriers B1, 82 facing hole transit being minimal, holes injected from the polysilicon gate 62A under the application of voltage $V_{g1}$ to the gate 62A (chosen at a magnitude to provide a hole energy of $E_H$ as shown) have a high probability of containing enough energy to tunnel through the barrier B1 presented by the layer 60A, pass over the barrier presented by the layer 58A, and tunnel through the barrier 82 presented by the layer 56A. Thus, the device 72 erases rapidly with application of voltage of magnitude $V_{g1}$ to the gate 62A.

Figure 19:
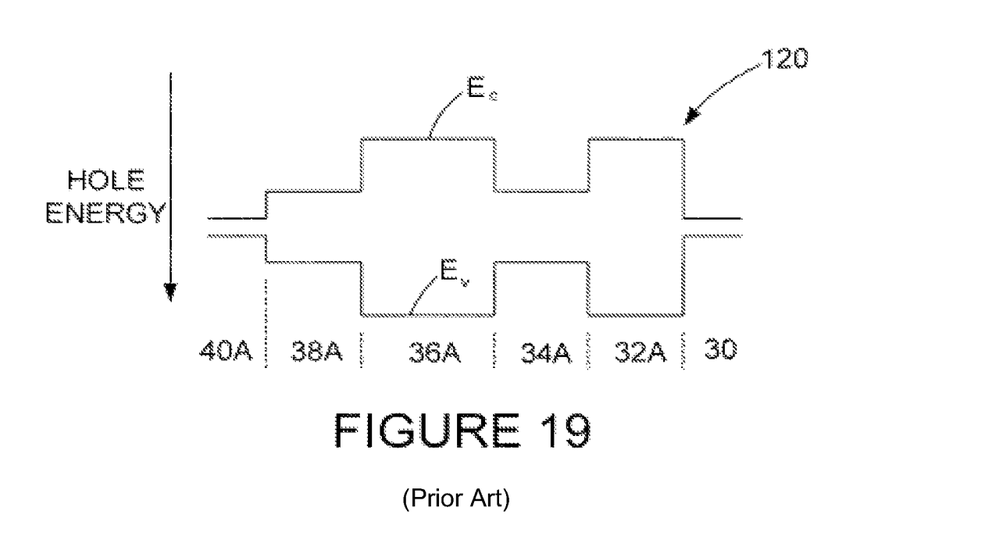
FIGS. 19-21 illustrate different states of energy band diagrams for the prior art memory device.
Figure 20:
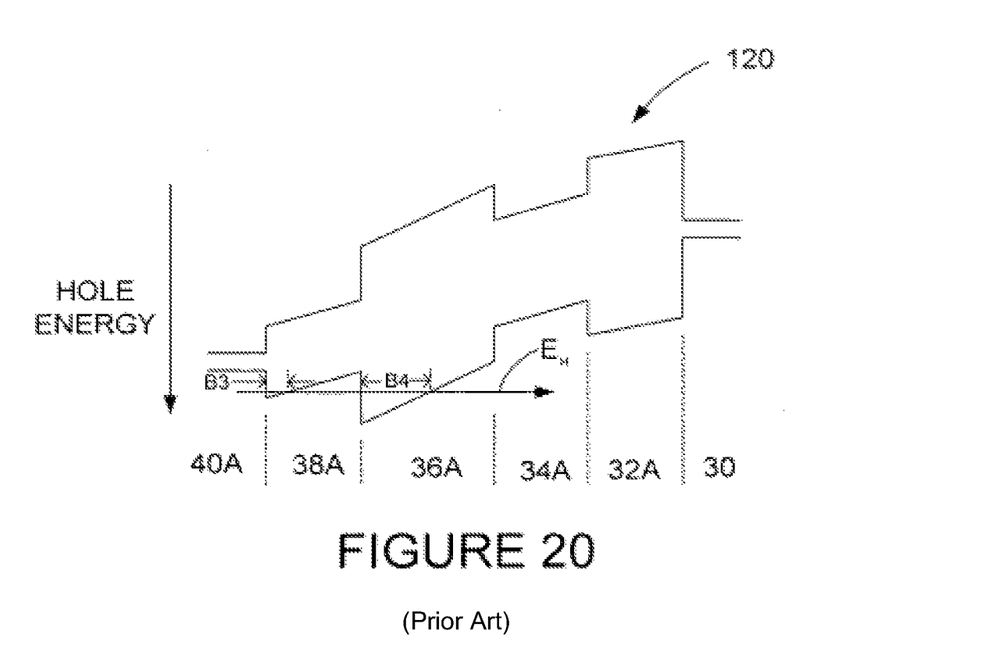

FIG. 19 illustrates the energy band diagram 120 for the prior art device 49 of FIG. 4, without electrical potential applied thereto. In the erasing of this memory device 49, holes must travel from the polysilicon gate 40A through the layers 38A,36A and into the storage layer 34A. Again, movement of holes from the gate 40A to the storage layer 34A with the energy band diagram as shown in FIG. 19 requires sufficient energy to overcome $E_v$ of the oxide layer 36A (hole energy increasing in a downward direction in FIG. 19). Applying the same positive voltage of magnitude $V_{g1}$ to the polysilicon gate 40A while holding the substrate 30, source 46 and drain 48 at ground causes the energy bands to shift to levels shown in FIG. 20. As will be seen in FIG. 20, while the energy barrier presented by the layer 38A is lowered (B3), and the energy barrier presented by the layer 36A is also lowered (B4), the layer 36A still presents a substantial barrier to hole movement from the polysilicon gate 40A to the storage layer 34A. With the barrier B4 presented by the oxide layer 36A still being substantial, holes injected from the polysilicon gate 40A under the application of voltage Vg1 to the gate 40A have a low probability of having enough energy to tunnel through the barrier B4 presented by the layer 36A. Thus, the device 49 erases relatively slowly with application of voltage of magnitude $V_{g1}$ to the gate 40A.

Figure 21:
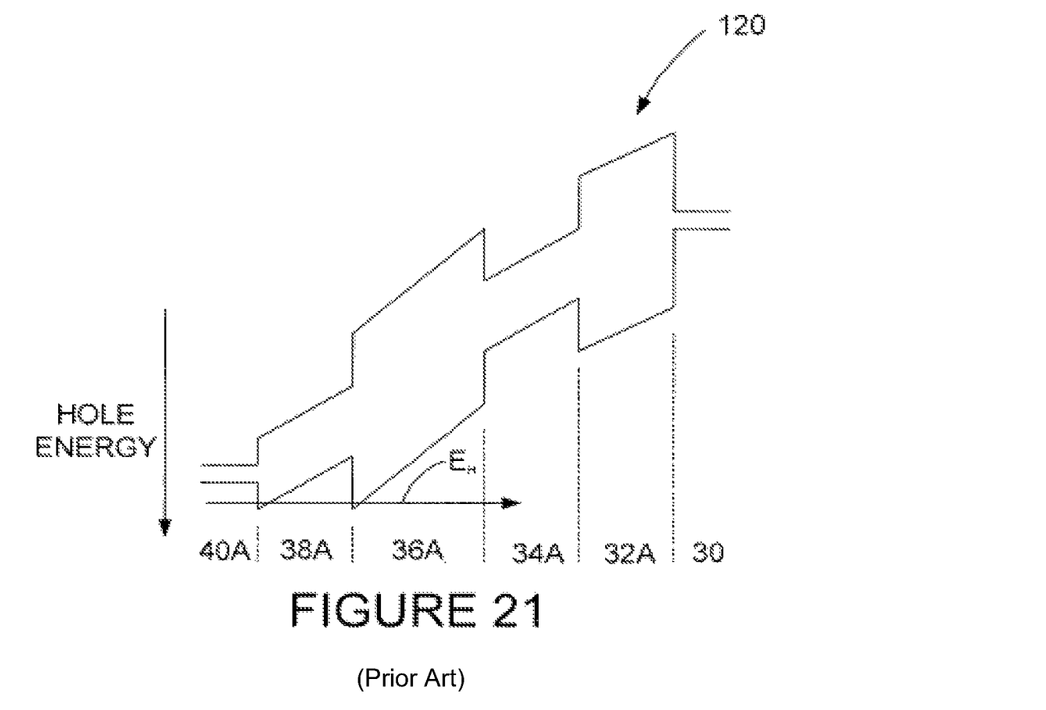
Figure 22:
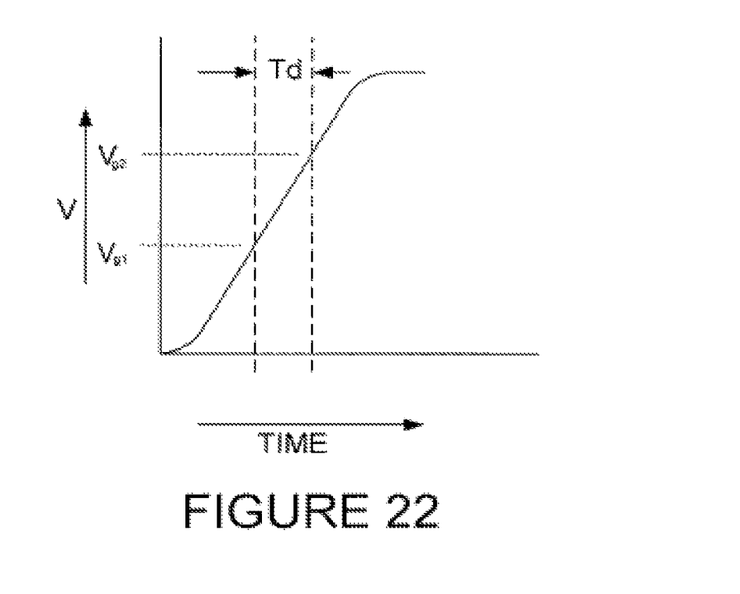
FIG. 22 is a timing diagram comparing operation of the present memory device with the prior art memory device.

In the prior art device 49, applying a positive voltage of magnitude $V_{g2}$ greater than $V_{g1}$ to the polysilicon gate 40A while holding the substrate 30, source 46 and drain 48 at ground causes the energy bands to shift to levels shown in FIG. 21. While this magnitude of voltage $V_{g2}$ applied to the gate 40A may be sufficient to reduce the barrier presented by the layer 36A to that achieved for layer 56A in FIG. 18, the time delay in building up the voltage applied to the gate 40A from voltage $V_{g1}$ voltage $V_{g1}$ to achieve this sufficiently lowered barrier (i.e., time delay Td in going from voltage $V_{g1}$ to voltage $V_{g2}$ as illustrated in FIG. 22) results in a longer erase time than that achieved in the present device 72.

It will therefore be seen that inclusion of the silicon oxynitride layer as shown and described significantly decreases erase speed of the device as compared to the prior art.

The foregoing description of the embodiments of the invention has been presented for purposes of illustration and description. It is not intended to be exhaustive or to limit the invention to the precise form disclosed. Other modifications or variations are possible in light of the above teachings.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A memory device comprising:
a substrate;
a tunneling layer provided over the substrate;
a floating gate provided over the tunneling layer;
a dielectric provided over the floating gate and comprising a first insulating layer, a second insulating layer, and a third insulating layer,
the first insulating layer provided over the floating gate and comprising silicon dioxide,
the second insulating layer provided over the first insulating layer and comprising silicon oxynitride, and
a third insulating layer provided over the second insulating layer and comprising silicon nitride;
a control gate provided over the dielectric and connected to a positive voltage source;
a source and a drain provided in the substrate,
wherein the source and the drain are in contact with opposite sides of a bottom surface of the tunneling layer;
a plurality of electron holes having sufficient energy to overcome a valence energy level of the first and third insulating layers and operable to travel through the first insulating layer, the second insulating layer, and the third insulating layer,
the plurality of electron holes being generated in the control gate in response to receiving the positive voltage at the control gate; and
a plurality of barriers corresponding to the first insulating layer, the second insulating layer, and the third insulating layer,
wherein the silicon oxynitride layer comprises alternating silicon nitride and silicon dioxide monolayers,
wherein the positive voltage source is also connected to the drain, and
wherein the source is connected to ground and allowing the substrate to float during an electrical erase operation,
wherein the positive voltage of the positive voltage source includes sufficient magnitude to eliminate a barrier corresponding to the second insulating layer, and to reduce the plurality of barriers corresponding to the first and third insulating layers, and
wherein a conductive energy level of the second insulating layer is higher than a conductive energy level of the third insulating layer.

2. The memory device of claim 1 wherein the control gate comprises a polysilicon control gate.

3. The memory device of claim 1, wherein a band gap of the first insulating layer is greater than a band gap of the second insulating layer, and wherein the band gap of the second insulating layer is greater than a band gap of the third insulating layer.

4. The memory device of claim 1, wherein a valence energy level of the second insulating layer is lower than the valence energy level of the third insulating layer when the positive voltage is not being applied to the control gate.

5. The memory device of claim 1, wherein the substrate is a p-type silicon substrate.

6. The memory device of claim 1, wherein the tunneling layer comprises silicon dioxide.

7. The memory device of claim 1, wherein the floating gate comprises silicon nitride.

8. The memory device of claim 1, wherein the second insulating layer directly interfaces the first insulating layer and the third insulating layer.

* * * * *